US011979995B2

(12) United States Patent
Jiang (10) Patent No.: US 11,979,995 B2
(45) Date of Patent: May 7, 2024

(54) FOLDABLE DISPLAY DEVICE (71) Applicant: Wuhan China Star Optoelectronics Semiconductor Display Technology Co., Ltd., Hubei (CN)

(72) Inventor: Guobao Jiang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 668 days.

(21) Appl. No.: 17/047,738

(22) PCT Filed: Jun. 28, 2020

(86) PCT No.: PCT/CN2020/098508
§ 371 (c)(1),
(2) Date: Oct. 15, 2020

(87) PCT Pub. No.: WO2021/217845
PCT Pub. Date: Nov. 4, 2021

(65) Prior Publication Data
US 2023/0156934 A1 May 18, 2023

(30) Foreign Application Priority Data
Apr. 26, 2020 (CN) .......................... 202010340668.6

(51) Int. Cl.
*H05K 5/02* (2006.01)
(52) U.S. Cl.
CPC ................... *H05K 5/0217* (2013.01)

(58) Field of Classification Search
CPC .... G06F 1/1616; G06F 1/1618; G06F 1/1681; G06F 1/1652; H05K 5/0217
See application file for complete search history.

(56) References Cited

U.S. PATENT DOCUMENTS

| 10,164,208 | B2 * | 12/2018 | Lee | ..................... B32B 5/145 |
| 10,368,452 | B2 * | 7/2019 | Yun | ..................... H10K 77/111 |
| 10,485,116 | B2 * | 11/2019 | Kim | ..................... H05K 5/0017 |
| 10,516,119 | B2 * | 12/2019 | Lee | ..................... H10K 50/844 |
| 10,558,242 | B2 * | 2/2020 | Kim | ..................... G06F 1/1681 |
| 11,487,327 | B2 * | 11/2022 | Horiuchi | ............. H04M 1/0268 |
| 11,503,727 | B2 * | 11/2022 | Seo | ..................... H05K 5/0217 |
| 11,513,560 | B2 * | 11/2022 | Dong | ..................... B32B 9/04 |
| 11,662,780 | B2 * | 5/2023 | Park | ..................... G06F 1/1616 361/679.01 |

(Continued)

FOREIGN PATENT DOCUMENTS

| CN | 107976725 | 5/2018 |
| CN | 110649087 | 1/2020 |

(Continued)

*Primary Examiner* — Sagar Shrestha (57) ABSTRACT

The present disclosure provides a foldable display device, which includes a front frame, a bottom frame assembly, a display panel and a support plate. The support plate includes a bending area and non-bending areas, a plurality of holes arranged in an array are provided in the bending area, the hole incudes two curved side walls arranged oppositely, and the side wall includes at least one curved portion, so as to improve the extension performance and the ability to restore deformation of the bending area of the support plate, and reduce the risk of separation of the inner film layer of the foldable display device.

20 Claims, 9 Drawing Sheets

(56) References Cited

U.S. PATENT DOCUMENTS

| | | | | |
|---|---|---|---|---|
| 11,823,595 | B2* | 11/2023 | Wang | H05K 7/1438 |
| 2013/0216740 | A1* | 8/2013 | Russell-Clarke | G06F 1/1616 |
| | | | | 219/121.72 |
| 2015/0049428 | A1* | 2/2015 | Lee | G06F 1/1652 |
| | | | | 361/679.27 |
| 2016/0357052 | A1* | 12/2016 | Kim | H10K 50/84 |
| 2017/0194580 | A1* | 7/2017 | Lee | H10K 50/8445 |
| 2018/0097197 | A1* | 4/2018 | Han | H05K 5/0017 |
| 2018/0192527 | A1* | 7/2018 | Yun | G09F 9/301 |
| 2019/0036068 | A1* | 1/2019 | Kim | H10K 59/87 |
| 2019/0132947 | A1* | 5/2019 | Koo | G06F 1/1652 |
| 2019/0196548 | A1* | 6/2019 | Kim | G06F 1/1641 |
| 2019/0200466 | A1* | 6/2019 | Kim | G06F 1/1641 |
| 2019/0334114 | A1* | 10/2019 | Park | H05K 5/0226 |
| 2020/0135065 | A1* | 4/2020 | Song | H05K 1/028 |
| 2020/0243780 | A1* | 7/2020 | Dong | H10K 71/00 |
| 2020/0319672 | A1* | 10/2020 | Kim | G06F 1/1641 |
| 2021/0165454 | A1* | 6/2021 | Dong | G06F 1/1652 |
| 2022/0103670 | A1* | 3/2022 | Liao | H04M 1/0216 |
| 2022/0206537 | A1* | 6/2022 | Park | G06F 3/044 |
| 2022/0269310 | A1* | 8/2022 | Xiong | G06F 1/1652 |
| 2022/0397969 | A1* | 12/2022 | Sim | G06F 1/1652 |

FOREIGN PATENT DOCUMENTS

| | | |
|---|---|---|
| CN | 110767096 | 2/2020 |
| CN | 110853525 | 2/2020 |
| CN | 110992828 | 4/2020 |
| KR | 2019-0003257 | 1/2019 |

* cited by examiner

FOLDABLE DISPLAY DEVICE

RELATED APPLICATIONS

This application is a National Phase of PCT Patent Application No. PCT/CN2020/098508 having International filing date of Jun. 28, 2020, which claims the benefit of priority of Chinese Patent Application No. 202010340668.6 filed on Apr. 26, 2020. The contents of the above applications are all incorporated by reference as if fully set forth herein in their entirety.

FIELD AND BACKGROUND OF THE INVENTION

The present disclosure relates to the technical field of display, and in particular, relates to a foldable display device.

With the development of display technology, consumers have more and more diversified and personalized demands for display panels. The foldable display device has the advantages of bendability and portability, which is favored by consumers.

In order to alleviate the waviness and crease problems of the existing foldable display device due to repeated folding or unfolding, it is necessary to attach a metal sheet covering an entire surface on a back side of the display panel and attach a support plate covering a non-bending area of the display panel. This not only increases the assembly difficulty and production costs, but also causes a step difference in a bending area of the display panel due to the support plate not covering the entire surface, thereby reducing the flatness of the display device.

As a result, the existing foldable display device has the problems of poor flatness and difficulty in assembly. Therefore, it is necessary to provide a foldable display device to improve the defects.

SUMMARY OF THE INVENTION

An object of the embodiment of the present disclosure is to provide a foldable display device, which is used to solve the problems of poor flatness and difficulty in assembly of the existing foldable display device.

To achieve the above object, the present disclosure provides a foldable display device, which comprises:

a front frame and a bottom frame assembly configured to make the foldable display device in a folded state and an unfolded state, wherein the foldable display device comprises a display panel provided between the front frame and the bottom frame assembly; and a support plate provided between the display panel and the bottom frame assembly;

wherein the support plate includes a bending area and non-bending areas provided on two sides of the bending area, a plurality of holes arranged in an array are provided in the bending area, the hole incudes two curved side walls arranged oppositely, and the side wall includes at least one curved portion.

According to an embodiment of the present disclosure, the bending area includes a bending axis, and the holes in two adjacent rows along the bending axis are arranged staggered or arranged side by side.

According to an embodiment of the present disclosure, an opening direction of the curved portion is parallel or perpendicular to the bending axis.

According to an embodiment of the present disclosure, the bending area further includes a plurality of bending openings, and the bending openings are formed by an intersection of the holes and an edge of the support plate.

According to an embodiment of the present disclosure, along the direction perpendicular to the bending axis, at least one row of holes is spaced between adjacent bending openings.

According to an embodiment of the present disclosure, the display panel includes a panel bending area, and an orthographic projection area of the bending area of the support plate on the display panel covers the panel bending area.

According to an embodiment of the present disclosure, a row of holes is spaced between adjacent bending openings, the opening direction of the curved portion is perpendicular to the bending axis; along the direction perpendicular to the bending axis, the width of the bending area is W3, the width of the panel bending area is Wd, and $Wd \leq W3 = nW1 + 2W2$;

wherein along the direction perpendicular to the bending axis, n is the number of the bending openings on one side of the support plate, W1 is a distance between a first end of the bending opening and a first end of the adjacent bending opening, W2 is a distance between the bending openings in the two adjacent rows.

According to an embodiment of the present disclosure, wherein the length of the support plate along the bending axis is L, and $L = NL2 + 2L1$;

wherein along the direction of the bending axis, N is the number of the holes in a row of the holes adjacent to the bending openings, L1 is a distance between a first end of the hole and a boundary of the bending area, and L2 is a distance between a first end of the hole and a first end of the adjacent hole in the same row.

According to an embodiment of the present disclosure, the bending area includes a first bending zone and a second bending zone located between the first bending zone and the non-bending area, the bending axis is located in the first bending zone, and the area and/or density of the holes located in the first bending zone and the area and/or density of the holes located in the second bending zone are different.

According to an embodiment of the present disclosure, the area of the holes located in the first bending zone is greater than the area of the holes located in the second bending zone, and the density of the holes located in the first bending zone is less than the density of the holes located in the second bending zone.

According to an embodiment of the present disclosure, the area and density of the holes located in the first bending zone are equal, and the area and density of the holes located in the second bending zone are equal.

According to an embodiment of the present disclosure, along the bending axis to the direction of the non-bending area, the size of the holes gradually decreases, and the density of the holes gradually increases.

According to an embodiment of the present disclosure, the holes located in the first bending zone are blind holes, and the opening of the blind holes face the side away from the display panel or the side close to the display panel.

According to an embodiment of the present disclosure, an elastic layer is provided between the display panel and the support plate, and the elastic layer covers the support plate and fills the holes.

The present disclosure further provides a foldable display device, which comprises a front frame and a bottom frame assembly configured to make the foldable display device in a folded state and an unfolded state, wherein the foldable display device comprises:

a display panel provided between the front frame and the bottom frame assembly; and a support plate provided between the display panel and the bottom frame assembly;

wherein the support plate includes a bending area and non-bending areas provided on two sides of the bending area, a plurality of holes arranged in an array are provided in the bending area, the hole incudes two curved side walls arranged oppositely, the side wall includes at least one curved portion, the bending area includes a bending axis, the holes in two adjacent rows along the bending axis are arranged staggered, and an opening direction of the curved portion is perpendicular to the bending axis.

According to an embodiment of the present disclosure, the bending area further includes a plurality of bending openings, and the bending openings are formed by an intersection of the holes and an edge of the support plate.

According to an embodiment of the present disclosure, along the direction perpendicular to the bending axis, at least one row of holes is spaced between adjacent bending openings.

According to an embodiment of the present disclosure, the display panel includes a panel bending area, and an orthographic projection area of the bending area of the support plate on the display panel covers the panel bending area.

The present disclosure further provides a foldable display device, which comprises a front frame and a bottom frame assembly configured to make the foldable display device in a folded state and an unfolded state, wherein the foldable display device comprises:

a display panel provided between the front frame and the bottom frame assembly; and a support plate provided between the display panel and the bottom frame assembly;

wherein the support plate includes a bending area and non-bending areas provided on two sides of the bending area, a plurality of holes arranged in an array are provided in the bending area, the hole incudes two curved side walls arranged oppositely, the side wall includes at least one curved portion, the bending area includes a bending axis, the holes in two adjacent rows along the bending axis are arranged side by side, and an opening direction of the curved portion is parallel to the bending axis.

According to an embodiment of the present disclosure, the bending area further includes a plurality of bending openings, and the bending openings are formed by an intersection of the holes and an edge of the support plate.

The embodiments of the present disclosure provide a foldable display device. By arranging multiple holes in the bending area of the support plate, the holes include two oppositely arranged curved side walls, each composed of at least one curved portion, to improve the extension performance and the ability of restoring deformation of the bending area of the support plate. The stress and misalignment between the support plate and the display panel are dispersed and reduced, and the risk of separation of the film layers in the foldable display device is reduced. Moreover, the integrated support plate can provide satisfactory support for each part of the display panel to improve the flatness of the foldable display device and reduce the difficulty of assembling the display panel with the front frame and bottom frame assembly.

BRIEF DESCRIPTION OF THE SEVERAL VIEWS OF THE DRAWINGS

In order to more clearly illustrate technical solutions in embodiments of the present disclosure, the drawings used in the description of the embodiments will be briefly introduced below. Obviously, the drawings in the following description are only some embodiments of the present disclosure, and those skilled in the art can obtain other drawings according to these drawings without any creative effort.

DESCRIPTION OF SPECIFIC EMBODIMENTS OF THE INVENTION

Structural and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto. In the drawings, units with similar structures are indicated by the same reference numerals.

Figure 1:
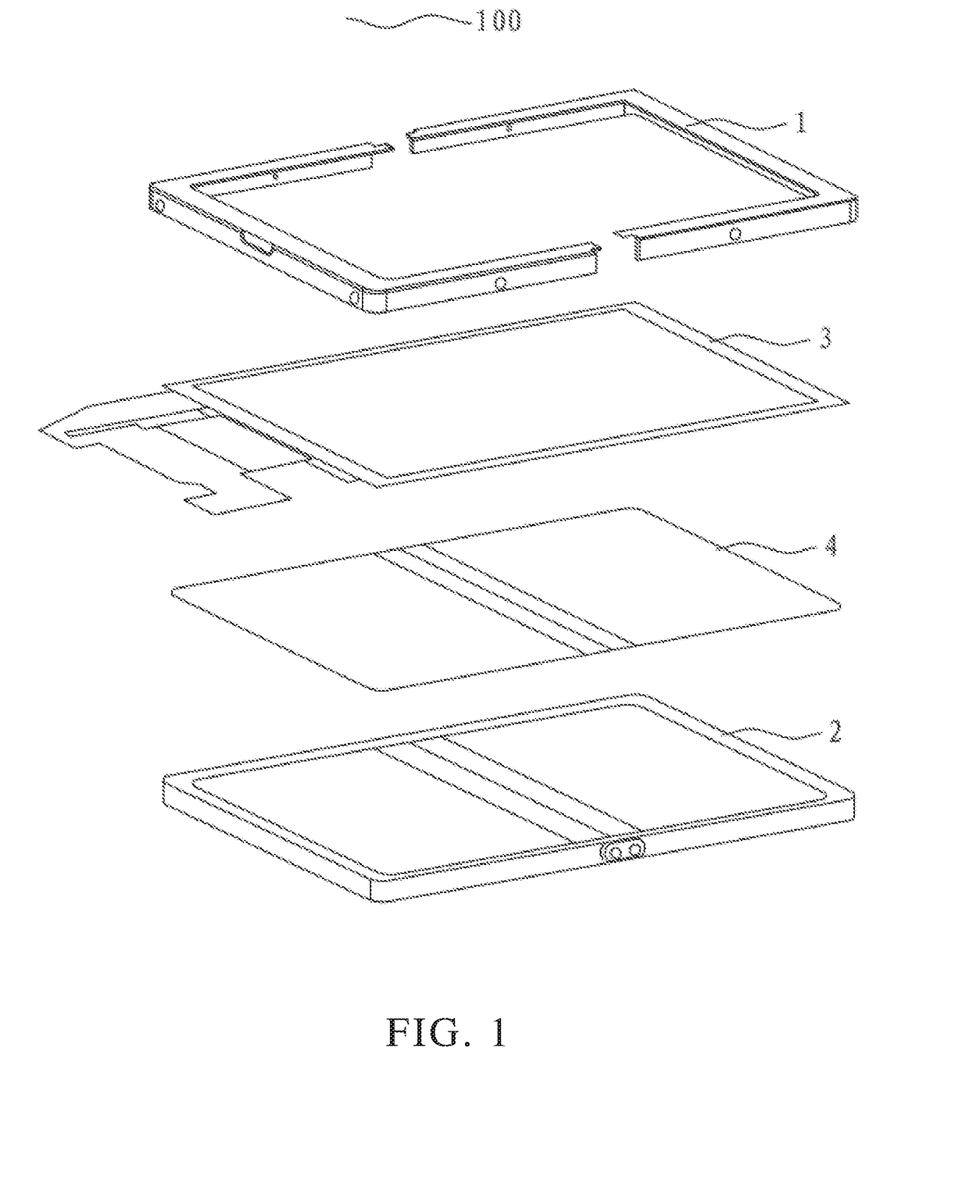
FIG. 1 is a schematic structural diagram of a foldable display device according to the present disclosure.

The present disclosure will be further described below in conjunction with the drawings and specific embodiments:

The embodiment of the present disclosure provides a foldable display device, which is described in detail below with reference to FIG. 1 to FIG. 10. Refer to FIG. 1, which is a schematic structural diagram of a foldable display device according to the present disclosure. The foldable display device 100 includes a front frame 1 and a bottom frame assembly 2 configured to make the foldable display device in a folded state and an unfolded state. The foldable display device 100 further includes a display panel 3 and a support plate 4. The front frame 1 is used to cover the display panel 3 and the bottom frame assembly 2, and the bottom frame assembly 2 is used to carry the front frame 1, the display panel 3 and the support plate 4. The display panel 3 is disposed between the front frame 1 and the bottom frame assembly 2, and the support plate 4 is disposed between the display panel 3 and the bottom frame assembly 2. The support plate 4 is located on a side of the display panel 3 away from its display surface.

Figure 2:
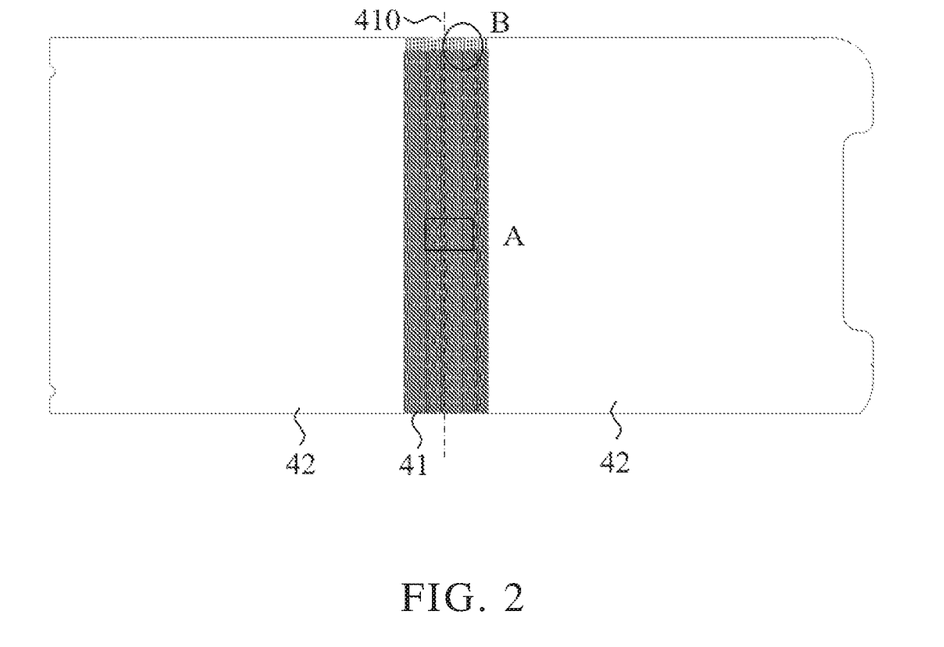
FIG. 2 is a schematic structural diagram of a support plate according to the present disclosure.

As shown in FIG. 2, which is a schematic structural diagram of a support plate 4 according to the present disclosure. The support plate 4 includes a bending area 41 and non-bending areas 42 located on two sides of the bending area 41. The bending area 41 includes a bending axis 410, and the support plate 4 can be unfolded or folded along the bending axis 410.

Figure 3:
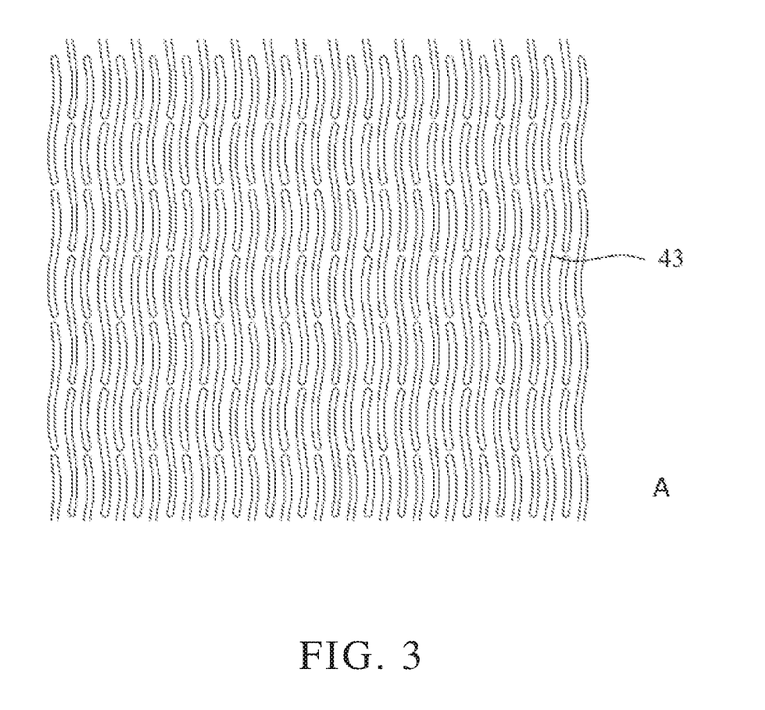
FIG. 3 is a schematic diagram of a portion A in FIG. 2.

Refer to FIG. 3, which is a schematic diagram of a portion A in FIG. 2. A plurality of holes 43 arranged in an array are provided in the bending area 41. The hole 43 includes two curved side walls arranged oppositely and two end portions connecting the two curved side walls. The curved side walls include two curved portions, and the opening directions of the two curved portions on the same side wall are opposite. The opening directions of the two curved portions corresponding to the two oppositely arranged curved side walls are the same, and the opening direction of the curved portions are perpendicular to the bending axis 410. During the bending and tensioning process of the supporting plate 4, the two curved side walls can be stretched and widened under the influence of the tensile stress on both sides, so that the support plate 4 has satisfactory extension performance. During the bending process of the foldable display device, the support plate 4 can be stretched and extended with the change of the length of the display panel 3, thereby correspondingly dispersing and reducing the compression stress on the display panel 3. The relative misalignment between the support plate 4 and the display panel 3 is reduced, and the risk of separation of the support plate 4 from the display panel 3 and an inner film layer of the display panel 3 is reduced.

Specifically, refer to FIG. 3, the holes 43 are arranged in an array with a certain density in the entire area of the bending area 41 to form a discontinuous grid structure, and any two adjacent rows of holes 43 are arranged alternately. The density of the arrangement of the holes 43 in the bending area 41 can be increased. The staggered openings 43 are affected by the material strength of the adjacent unopened parts. Moreover, the staggered holes 43 are affected by the material strength of the adjacent unopened portions. After the bending force disappears, the stretched portion in the middle of the holes 43 can quickly return to its original shape, so that the support plate 4 has a satisfactory ability to restore deformation. The ripples and creases generated by the repeated folding and unfolding of the display panel are reduced, and the flatness of the display panel 3 after being flattened is restored.

Preferably, along the direction of the bending axis 410, the gap between one row of holes 43 in two adjacent rows of holes corresponds to the intersection of the two curved portions of the curved side walls of the other row of holes 43 (hole 43 in the middle). In this way, the density of the holes 43 is maximized, and the middle portion of the hole 43 corresponds to the portion with the most unopened materials, so as to give the portion 43 enough space for stretching and deformation. Moreover, it does not affect the wall thickness of the larger portion of the hole 43 at both ends. Under the condition of ensuring sufficient support strength in the bending area of the support plate 4, the extension performance and the ability to recover the deformation of the support plate are improved, so that the elongation rate of the support plate 4 can reach more than 10%.

Figure 5:
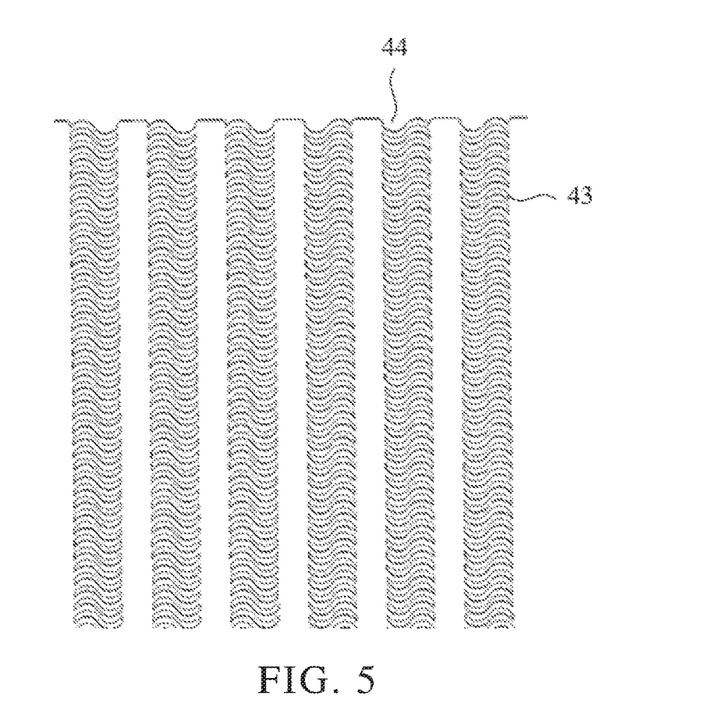
FIG. 5 is another schematic structural diagram of a support plate according to the present disclosure.
Figure 6:
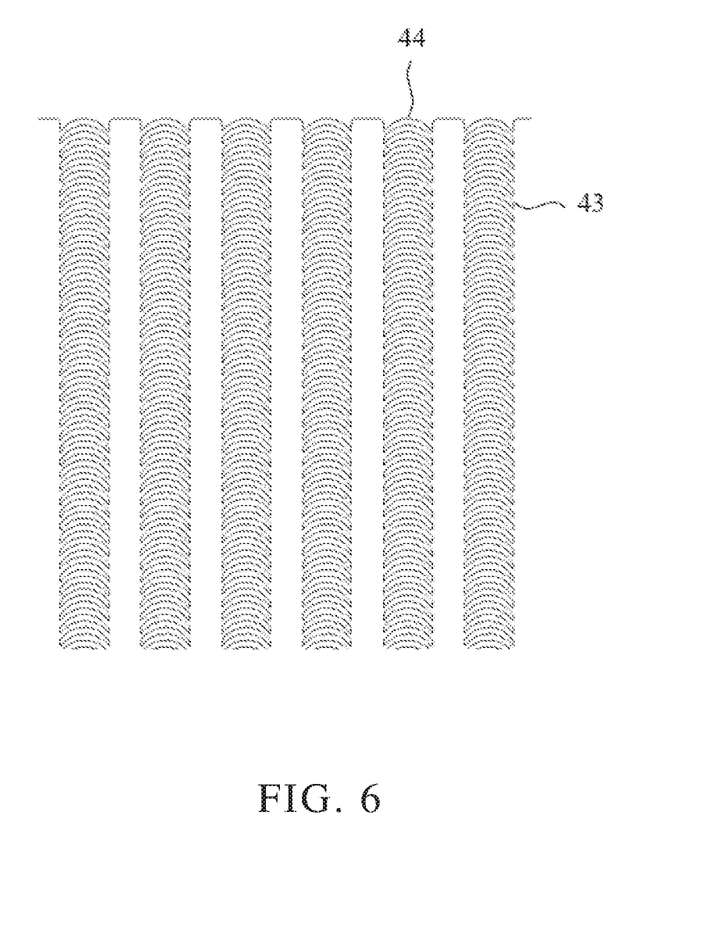
FIG. 6 is another schematic structural diagram of a support plate according to the present disclosure.

FIG. 5 or FIG. 6 is another schematic structural diagram of a support plate 4 according to the present disclosure. As a modified structure of the arrangement of the holes 43, the holes 43 in two adjacent rows can also be arranged side by side as shown in FIG. 5 and FIG. 6. The side wall of the hole 43 in FIG. 5 is also composed of two curved portions, and the side wall of the hole 43 in FIG. 6 is composed of a curved portion, and the opening direction of the curved portion is parallel to the bending axis 410. During the bending and tensioning process of the support plate 4 of the hole 43, the two curved side walls can be stretched and elongated due to the tensile stress at both ends. Therefore, the technical effects of improving the extension performance of the support plate 4 and dispersing and reducing the stress in the bending area 41 can also be achieved, and are not limited here.

Preferably, the shape of the orthographic projection pattern of the curved portion of the curved side wall of the hole 43 on the support plate 4 should be a circular arc. The radius of curvature or radian R of the circular arc can be calculated according to the extension length of the support plate 4 in the folded state, the deformation amount of the hole 43 and the number of the hole 43. The curved side wall is not limited to one or two curved portions provided in the said embodiment, and it can also be composed of more than two curved portions. At the same time, the shape of the orthographic projection pattern of the curved portion is not limited to a circular arc. In some embodiments, it can also be any other curve, which is not limited here.

Preferably, the holes 43 provided in the embodiment of the present disclosure include but is not limited to through holes or blind holes. In this way, the support plate 4 can disperse and reduce the stress when the support plate 4 is bent.

Figure 4:
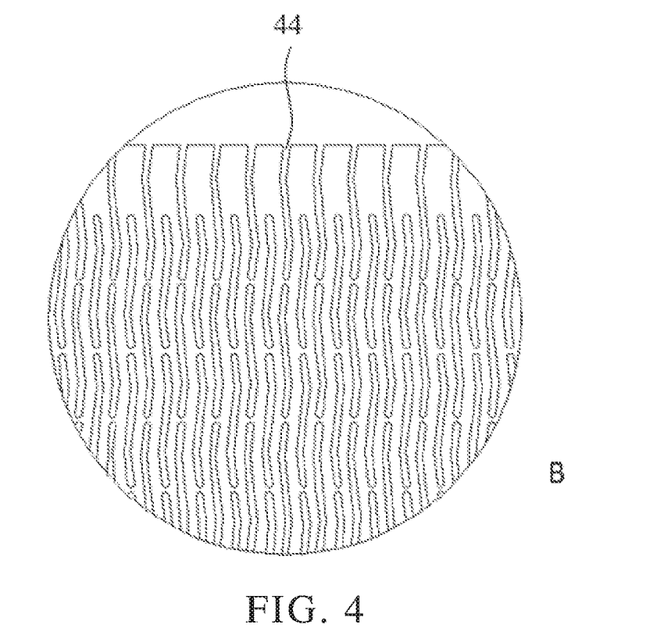
FIG. 4 is a schematic diagram of a portion B in FIG. 2.

Refer to FIG. 4, which is a schematic diagram of a portion B in FIG. 2. Two ends of the bending area 41 also include a plurality of bending openings 44, the bending openings 44 are formed by the intersection of the holes 43 and the edge of the support plate 4, and the bending openings 44 located at two ends of the bending area 41 are at the same distance from the adjacent holes 43. By providing openings at two ends of the bending area 41 of the support plate 4, the extension performance of the support plate 4 can be improved. Moreover, reducing the material of the support plate 4 at two ends of the bending area 41 can effectively reduce the compression stress generated on the display panel at the two ends of the bending area 41 during the bending process.

Specifically, in the embodiment of the present disclosure, since the holes 43 in two adjacent rows are arranged alternately, there is a row of holes 43 between the adjacent bending openings 44. In some embodiments, two rows or more than two rows of holes may also be spaced between adjacent bent openings, which is not specifically limited here.

In the embodiment of the present disclosure, the display panel 3 includes a panel bending area and a panel non-bending area located on both sides of the panel bending area. In the unfolded state, the bending area 41 of the support plate 4 covers the panel bending area in the orthographic projection area of the display panel 3. The width of the bending area 41 of the support plate 4 in the direction perpendicular to the bending axis 410 is greater than the width of the panel bending area in the direction perpendicular to the bending axis. The bending area 41 of the support plate 4 beyond the panel bending area is stretched and extended during the bending process. It is possible to provide sufficient space for stress relief and strain dislocation movement at the junction of the panel bending area and the panel non-bending area of the display panel 3, thereby reducing the risk of separation of the display panel 3.

In order to ensure sufficient stress relief space, in the unfolded state, the width of either side of the bending area 41 in the direction perpendicular to the bending axis 410 is at least 1 mm larger than the same side of the panel bending area.

Figure 7:
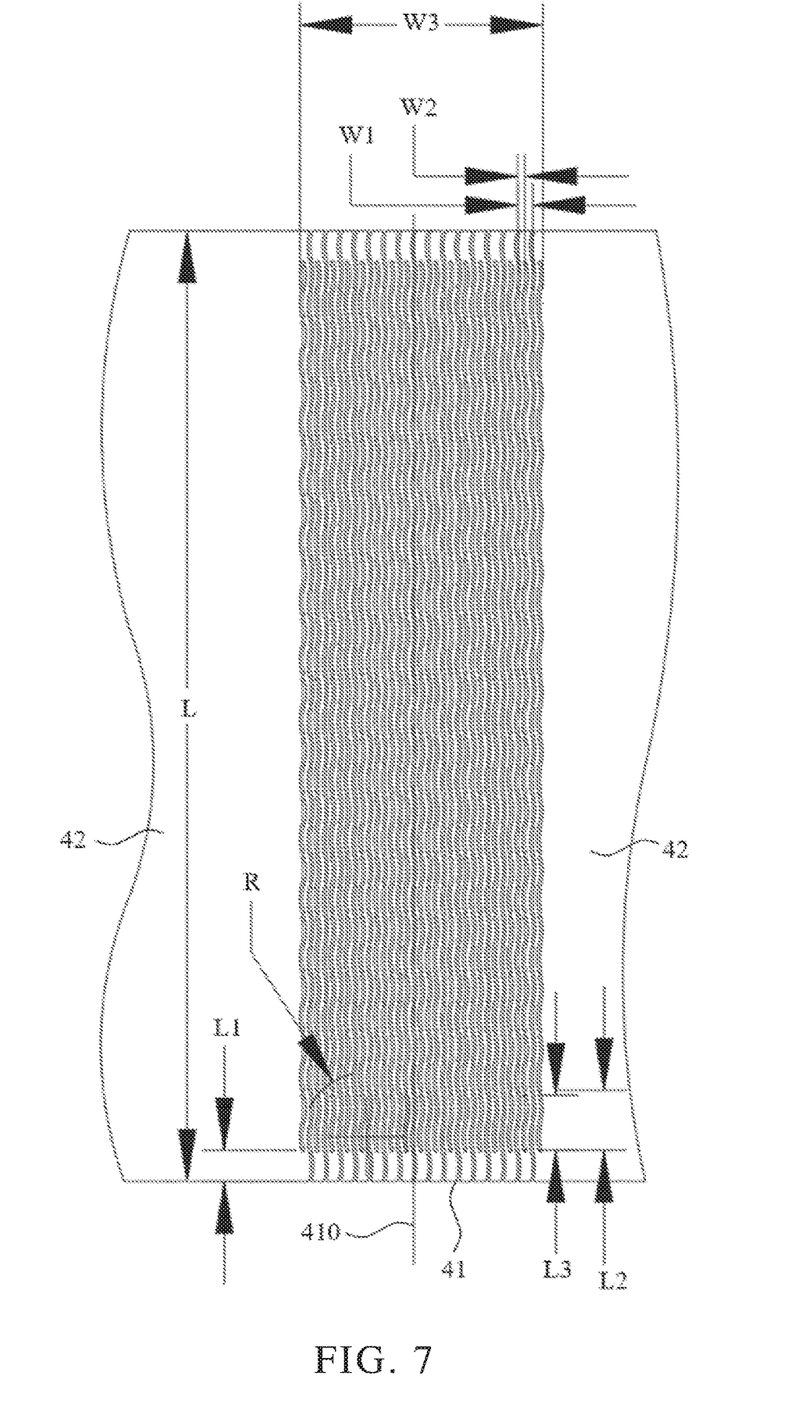
FIG. 7 is a schematic structural diagram of a bending area of the support plate according to the present disclosure.

Specifically, refer to FIG. 7, which is a schematic structural diagram of a bending area of the support plate according to the present disclosure. In the unfolded state, along the direction perpendicular to the bending axis 410, a row of holes 43 is spaced between adjacent bending openings 44. The number of bending openings 44 provided on one side of the support plate 4 is n. The distance between the first end of the bending opening 44 and the first end of the adjacent bending opening is W1. The distance between two adjacent rows of holes is W2, and the width of the bending area 41 is W3, wherein, the width of the panel bending area of the display panel 3 is Wd, and Wd≤W3=nW1+2W2.

Along the direction of the bending axis 410, the number of holes 43 in the row of holes adjacent to the bending opening 44 is N. The distance between the first end of the hole 43 and the boundary of the bending area 41 is L1. The distance between the first end of the hole 43 and the first end of the adjacent hole in the same row is L2. The length of the hole 43 is L3, wherein the length of the supporting plate 4 along the direction of the bending axis 410 is L, and L=NL2+2L1.

Figure 8:
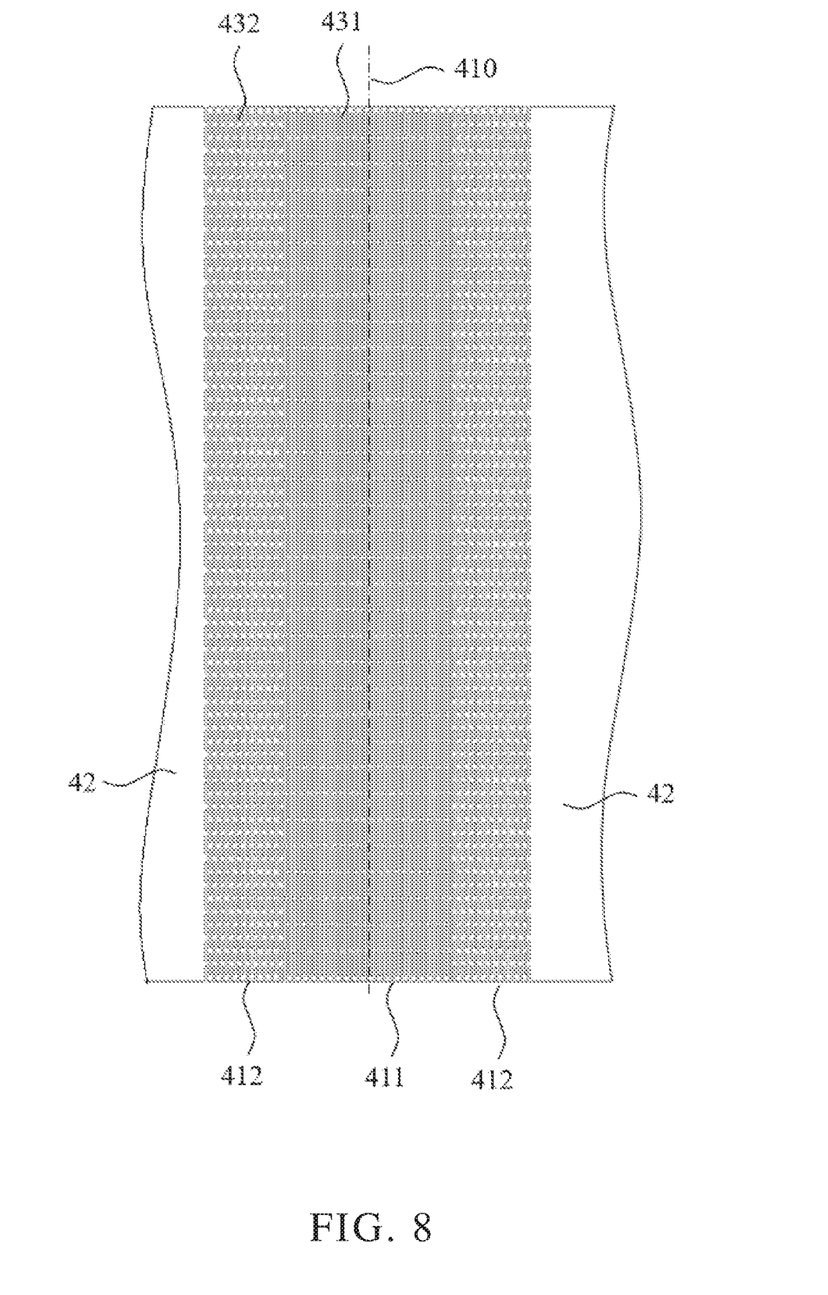
FIG. 8 is another schematic structural diagram of a support plate according to the present disclosure.

The embodiments of the present disclosure also provide a foldable display device. The structure of the foldable display device is substantially the same as that of the foldable display device provided in the above-mentioned embodiments. The difference is shown in FIG. 8, which is another schematic structural diagram of a support plate according to the present disclosure. The bending area 41 of the support plate 4 includes a first bending zone 411 and a second bending zone 412 located between the first bending zone 411 and the non-bending area 42. The bending axis 410 is located in the first bending zone 411. The first bending zone 411 includes first holes 431. The second bending zone 412 includes second holes 432. The size and density of the first holes 431 are different from the size and density of the second holes 432.

Figure 9:
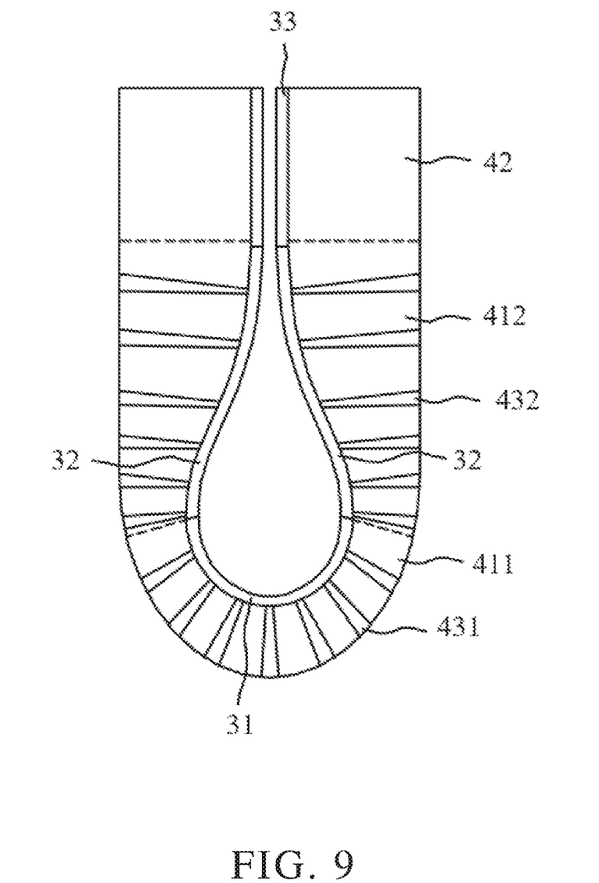
FIG. 9 is a schematic diagram of a folded state of the foldable display device according to the present disclosure.

Refer to FIG. 9, which is a schematic diagram of a folded state of the foldable display device according to the present disclosure. The panel bending area of the display panel 3 further includes a first panel bending zone 31 and a second panel bending zone 32 located between the first panel bending zone 31 and a panel non-bending area 33. The second panel bending zone 31 is located in a bending transition area between the first panel bending zone 31 and the panel non-bending area 33. When the display panel 3 is in the folded state, the display surfaces of the non-bending areas 32 are arranged relatively parallel, and the panel bending area forms a drop shape. The first panel bending zone 31 is concavely bent inward. The second panel bending zone 32 protrudes and bends toward the second panel bending zone 32 on the opposite side. The slope of the second panel bending zone 32 is greater than the slope of the first panel bending zone 31, resulting in the second panel bending zone 32 receiving greater stress than the first panel bending zone 31. As a result, the relative displacement of the second panel bending zone 32 is greater than the relative displacement of the first panel bending area 31, and the risk of film layer separation is higher than that of the first panel bending zone 31.

Preferably, the size of the first holes 431 in the first bending zone 411 should be larger than the size of the second holes 432 in the second bending zone 412. The density of the first holes 431 in the first bending zone 411 should be less than the density of the second holes 432 in the second bending zone 412. By reducing the size of the holes and increasing the density of the holes, the extension performance and the resilience of the second bending zone 412 of the support plate are greater than that of the first bending zone 411. The stress of the second bending zone 412 is dispersed and reduced during bending, thereby correspondingly reducing the stress received by the second panel bending zone 32, so that the forces on each portion of the display panel 3 are balanced, and the risk of film separation is reduced.

Furthermore, the size and density of the holes 43 in the bending area 41 show a multi-stage change. That is, the size and density of the first holes 431 in the first bending zone 411 are equal, and the size and density of the second holes 432 in the second bending zone 412 are equal. In this way, the stress of the second bending zone 412 during bending can be dispersed and reduced, the stresses on the various portions of the display panel 3 are balanced, and the risk of film layer separation can be reduced. In addition, the multi-stage change of the size and density of the hole 41 in the bending area 41 is not limited to the three-stage change provided by the embodiment of the present disclosure. In other embodiments, it may also include fewer or more stage changes, all of which can achieve the above technical effects, and are not limited here.

In some embodiments, the size and density of the holes 43 in the bending area 41 may also show a gradual change. That is, along the bending axis 410 to the non-bending zone 42, or along the bending axis to the boundary between the first bending zone 411 and the second bending zone 421, or along the boundary between the first bending zone 411 and the second bending zone 412 to the non-bending area 42, the size of the holes 43 decrease (or increases), and the density of the holes 43 gradually increases (or decreases). The same technical effect as the above embodiment can also be achieved, and it is not limited here.

As a deformation structure of the size and density of the holes 43 in the bending area 41, the first bending zone 411 and the second bending zone 412 can keep one of the size and density of the holes changed while the other remains unchanged. In this way, the effects of increasing the bending performance and restoring deformation ability of the support plate 4, and dispersing and reducing the stress in the bending area 41 of the support plate 4 can also be achieved.

Furthermore, the second holes 432 located in the second bending zone 412 are through holes, and the first holes 431 located in the first bending zone 411 are blind holes. The opening of the blind holes faces the side away from the display panel 3 or the side close to the display panel 3.

Preferably, the opening of the blind holes faces the side away from the display panel 3, and the unopened portion of the first bending zone 411 of the support plate 4 is kept unfolded. In the case of through holes combined with blind holes, sufficient extension performance and deformability recovery ability of the support plate 4 are satisfied, and the support plate 4 can also support the first panel bending zone 31 evenly. The ripples and creases of the display panel 3 caused by repeated folding and unfolding are reduced, and the flatness of the display panel 3 is improved. In some embodiments, the opening direction of the blind holes can also be a side close to the display panel 3, which can also achieve the effect of improving the extension performance of the support plate 4 and the ability of restoring deformation, and it is not limited here.

Figure 10:
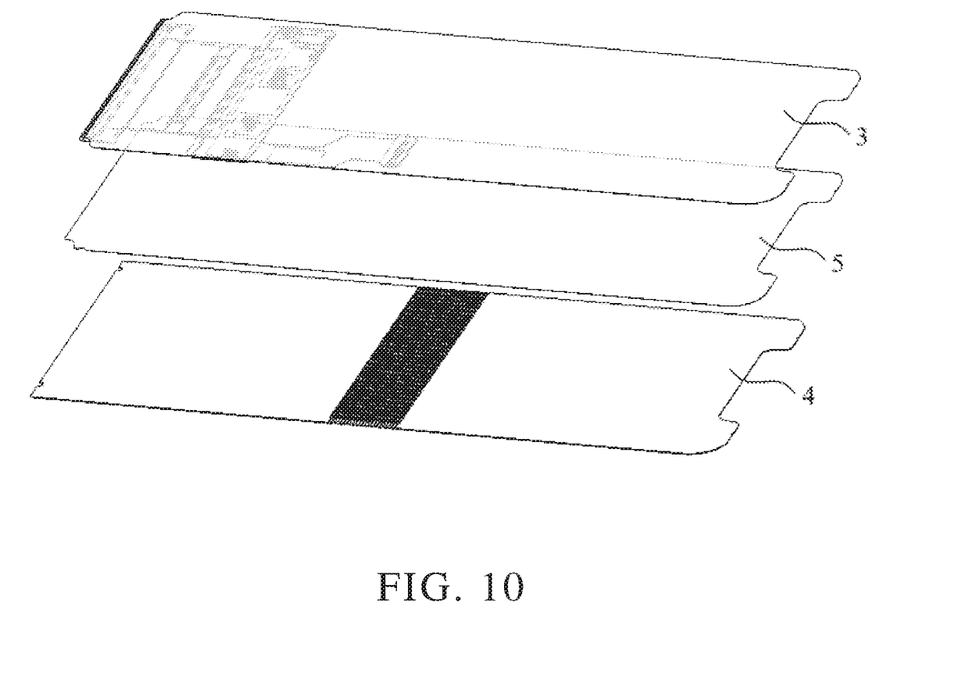
FIG. 10 is a schematic diagram of a combination of the support plate and the display panel according to the present disclosure.
Figure 11:
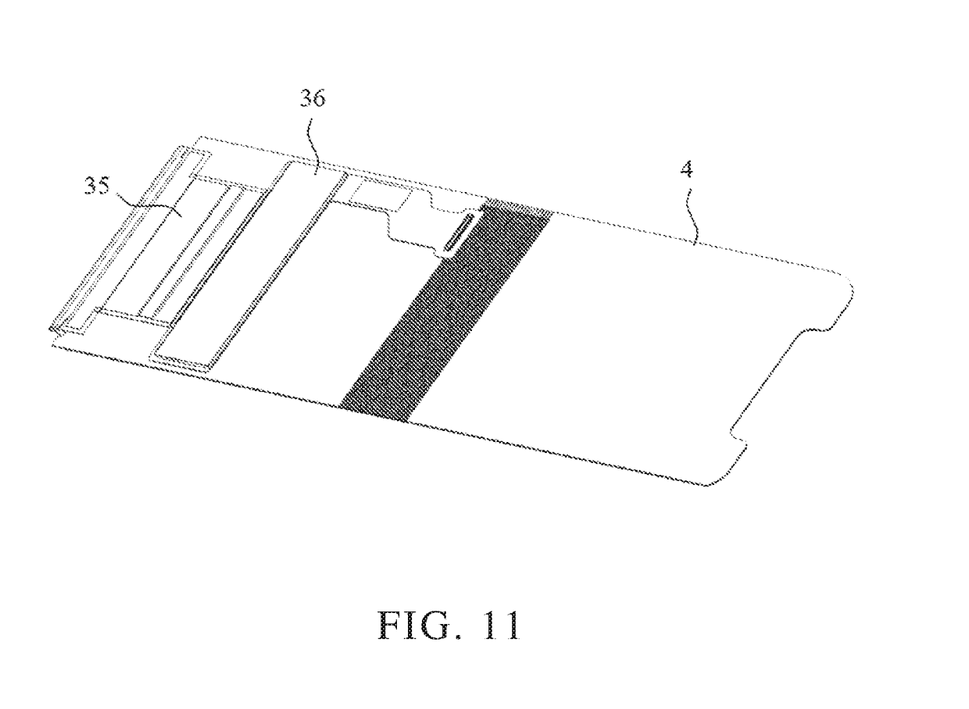
FIG. 11 is a schematic diagram of a chip on film and a flexible circuit board of the display panel according to the present disclosure.

In the embodiment of the present disclosure, as shown in FIG. 10, the display panel 3 and the support plate 4 are bonded through the entire surface of a flexible foldable optical adhesive layer 5. As shown in FIG. 11, the display panel 3 includes a chip on film 35 and a flexible circuit board 36. The chip on film 35 and the flexible circuit board 36 can be bent to the side of the support board 4 away from the display panel 3. The bending of the display panel 3 is not be affected, and the screen-to-body ratio of the foldable display device 100 can be increased.

Figure 12:
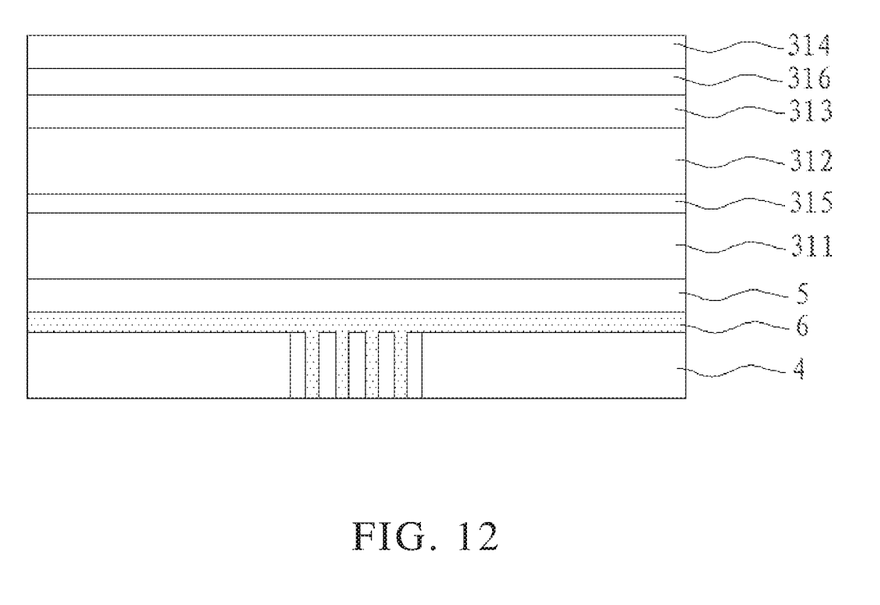
FIG. 12 is a schematic diagram of a film structure of the display panel according to the present disclosure.

Specifically, as shown in FIG. 12, which is a schematic diagram of a film structure of the display panel 3 according to the present disclosure. The display panel 3 further includes a backplane 311, a touch display device layer 312, a polarizer 313, and a packaging cover plate 314 that are stacked. The backplane 311 and the touch display device layer 312 are bonded by a pressure-sensitive adhesive layer 315. The packaging cover plate 314 and the polarizer 313 are bonded through an optical glue layer 316.

Preferably, an elastic layer 6 is provided between the display panel 3 and the support plate 4, and the elastic layer is provided between the support plate 4 and the foldable optical adhesive layer 5, and the entire surface of the elastic layer covers the support plate 4. In the embodiment, the material of the elastic layer 6 is silicone resin, which is liquid before curing and has satisfactory fluidity. When the silicone resin is screen-printed on the surface of the support plate 4, the silicone resin material can be filled into the holes 43, and after curing, can form an integrated grid structure with the holes 43 of the support plate. Silicone resin material has desirable elasticity and elongation performance. During the bending process of the support plate 4 and the display panel 3, the elastic layer 6 can move synchronously with the adjacent flexible foldable optical adhesive layer 5. The relative misalignment between the support plate 4 and the display panel 3 is reduced, which reduces the risk of film separation between the display panel 3 and adjacent film layers. Moreover, the elastic layer 6 is filled into the holes 43, which can further provide the holes 43 with satisfactory deformability recovery. The display panel 3 can be quickly restored to an unfolded state after being folded, thereby effectively eliminating creases and ripples caused by folding.

Optionally, in other embodiments, the elastic layer 6 can also be replaced by a foam rubber layer, which also has satisfactory extension performance and deformability recovery ability. It can achieve the same technical effect as the elastic layer 6.

In the embodiment of the present disclosure, the material of the support plate 4 is stainless steel (SUS). It has high toughness and plasticity, which can not only provide good extension performance to the bending area 41 of the support plate 4. The satisfactory strength of the support plate can also provide satisfactory support for all portions of the display panel 3 to improve the flatness of the display panel 3 in the unfolded state. The difficulty of assembling and matching the flexible display panel 3 with the front frame and the bottom frame assembly is reduced, and there is no need to replace the flexible assembly equipment, thereby reducing the investment cost.

In addition, in order to ensure satisfactory strength and elongation of the support plate 4, the thickness of the support plate 4 should be between 0.02 mm and 1 mm. If the thickness is too thin, the support strength of the support plate 4 will be insufficient. If the thickness is too thick, the extension performance and deformation recovery ability of the support plate 4 will deteriorate. The specific value can be selected according to actual needs, and it is not limited here.

In particular, in some embodiments, the support plate 4 may be used to replace the back plate 31 in the display panel 3. It is beneficial to reduce the thickness of the display panel 3 and reduce the stress between the film layers, thereby reducing the relative displacement between the film layers. The risk of film layer separation is reduced, the bending resistance of the display panel 3 is improved, and the cost of the back plate 31 can be saved and the corresponding manufacturing process can be reduced.

In other embodiments, the material of the support plate 4 can also be materials with the same or similar properties such as Al, Mg or liquid metal. The same technical effect as the above-mentioned stainless steel can be achieved, and there is no specific limitation here.

The beneficial effects of the embodiments of the present disclosure: the embodiments of the present disclosure provide a foldable display device. By arranging multiple holes in the bending area of the support plate, the holes include two oppositely arranged curved side walls, each composed of at least one curved portion, to improve the extension performance and the ability of restoring deformation of the bending area of the support plate. The stress and misalignment between the support plate and the display panel are dispersed and reduced, and the risk of separation of the film layers in the foldable display device is reduced. Moreover, the integrated support plate can provide satisfactory support for each part of the display panel to improve the flatness of the foldable display device and reduce the difficulty of assembling the display panel with the front frame and bottom frame assembly.

In summary, although the present disclosure has been disclosed as above with preferred embodiments, however, the foregoing preferred embodiments are not intended to limit the present disclosure. Those of ordinary skill in the art can make various modifications and decorations without departing from the spirit and scope of this present disclosure. Therefore, the protection scope of this present disclosure is subject to the scope defined by the claims.

What is claimed is:

1. A foldable display device, comprising a front frame and a bottom frame assembly configured to make the foldable display device in a folded state and an unfolded state, wherein the foldable display device comprises:
   a display panel provided between the front frame and the bottom frame assembly; and
   a support plate provided between the display panel and the bottom frame assembly;
   wherein the support plate comprises a bending area and non-bending areas provided on two sides of the bending area, a plurality of holes arranged in an array are provided in the bending area, a wall defining each of the holes comprises two curved side walls arranged oppositely and two end portions each connecting the two curved side walls, the two curved side walls are parallel to each other, and each of the two curved side walls comprises two curved portions having opposite opening directions; and
   wherein the bending area comprises a first bending zone and a second bending zone located between the first bending zone and the non-bending area, the bending axis is located in the first bending zone, a distribution density of the holes located in the first bending zone is less than a distribution density of the holes located in the second bending zone.

2. The foldable display device according to claim 1, wherein the bending area comprises a bending axis, and the holes in two adjacent rows along the bending axis are arranged staggered or arranged side by side.

3. The foldable display device according to claim 2, wherein the opening directions of the curved portions are parallel or perpendicular to the bending axis.

4. The foldable display device according to claim 3, wherein the bending area further comprises a plurality of bending openings, and the bending openings are formed by an intersection of the holes and an edge of the support plate.

5. The foldable display device according to claim 4, wherein along a direction perpendicular to the bending axis, at least one row of the holes is spaced between adjacent ones of the bending openings.

6. The foldable display device according to claim 5, wherein the display panel comprises a panel bending area, and an orthographic projection area of the bending area of the support plate on the display panel covers the panel bending area.

7. The foldable display device according to claim 6, wherein one row of the holes is spaced between the adjacent ones of the bending openings, the opening direction of the curved portion is perpendicular to the bending axis; along the direction perpendicular to the bending axis, a width of the bending area is W3, a width of the panel bending area is Wd, and $Wd \leq W3 = nW1 + 2W2$; and wherein along the direction perpendicular to the bending axis, n is a number of the bending openings on a side of the support plate, W1 is a distance between a first end of one of the bending openings and a first end of an adjacent one of the bending openings, and W2 is a distance between the bending openings in two adjacent rows.

8. The foldable display device according to claim 7, wherein a length of the support plate along the bending axis is L, and $L = NL2 + 2L1$; and wherein along a direction of the bending axis, N is a number of the holes in one row adjacent to the bending openings, L1 is a distance between a first end of one of the holes and a boundary of the bending area, and L2 is a distance between the first end of the one of the holes and a first end of an adjacent one of the holes in the same row.

9. The foldable display device according to claim 2, wherein an area of the holes located in the first bending zone and an area of the holes located in the second bending zone are different.

10. The foldable display device according to claim 9, wherein the area of the holes located in the first bending zone is greater than the area of the holes located in the second bending zone.

11. The foldable display device according to claim 10, wherein an area of each of the holes located in the first bending zone is invariant, the distribution density of the holes located in the first bending zone is invariant; and an area of each of the holes located in the second bending zone is invariant, the distribution density of the holes located in the second bending zone is invariant.

12. The foldable display device according to claim 10, wherein along a direction from the bending axis to the non-bending area, the area of one of the holes gradually decreases, and the distribution density of the holes gradually increases.

13. The foldable display device according to claim 9, wherein the holes located in the first bending zone are blind holes, and an opening of each of the blind holes faces a side away from the display panel or a side close to the display panel.

14. The foldable display device according to claim 1, wherein an elastic layer is provided between the display panel and the support plate, and the elastic layer covers the support plate and fills the holes.

15. A foldable display device, comprising a front frame and a bottom frame assembly configured to make the foldable display device in a folded state and an unfolded state, wherein the foldable display device comprises:

a display panel provided between the front frame and the bottom frame assembly; and a support plate provided between the display panel and the bottom frame assembly;

wherein the support plate comprises a bending area and non-bending areas provided on two sides of the bending area, a plurality of holes arranged in an array are provided in the bending area, a wall defining each of the holes comprises two curved side walls arranged oppositely and two end portions each connecting the two curved side walls, the two curved side walls are parallel to each other, each of the two curved side walls comprises two curved portions having opposite opening directions, the bending area comprises a bending axis, the holes in two adjacent rows along the bending axis are arranged staggered, and the opening directions of the curved portions are perpendicular to the bending axis; and wherein the bending area comprises a first bending zone and a second bending zone located between the first bending zone and the non-bending area, the bending axis is located in the first bending zone, a distribution density of the holes located in the first bending zone is less than a distribution density of the holes located in the second bending zone.

16. The foldable display device according to claim 15, wherein the bending area further comprises a plurality of bending openings, and the bending openings are formed by an intersection of the holes and an edge of the support plate.

17. The foldable display device according to claim 16, wherein along a direction perpendicular to the bending axis, at least one row of the holes is spaced between adjacent ones of the bending openings.

18. The foldable display device according to claim 17, wherein the display panel comprises a panel bending area, and an orthographic projection area of the bending area of the support plate on the display panel covers the panel bending area.

19. A foldable display device, comprising a front frame and a bottom frame assembly configured to make the foldable display device in a folded state and an unfolded state, wherein the foldable display device comprises:

a display panel provided between the front frame and the bottom frame assembly; and a support plate provided between the display panel and the bottom frame assembly;

wherein the support plate comprises a bending area and non-bending areas provided on two sides of the bending area, a plurality of holes arranged in an array are provided in the bending area, a wall defining each of the holes comprises two curved side walls arranged oppositely and two end portions each connecting the two curved side walls, the two curved side walls are parallel to each other, each of the two curved side walls comprises two curved portions having opposite opening directions, the bending area comprises a bending axis, the holes in two adjacent rows along the bending axis are arranged side by side, and the opening directions of the curved portions are parallel to the bending axis; and wherein the bending area comprises a first bending zone and a second bending zone located between the first bending zone and the non-bending area, the bending axis is located in the first bending zone, a distribution density of the holes located in the first bending zone is less than a distribution density of the holes located in the second bending zone.

20. The foldable display device according to claim 19, wherein the bending area further comprises a plurality of bending openings, and the bending openings are formed by an intersection of the holes and an edge of the support plate.

* * * * *